United States Patent [19]

Drouet

[11] 4,446,420

[45] May 1, 1984

[54] METHOD AND DEVICE FOR DETECTING AND LOCATING FAULT AND/OR PARTIAL DISCHARGES IN A GAS-INSULATED ELECTRICAL EQUIPMENT

[75] Inventor: Michel G. Drouet, St-Bruno, Canada

[73] Assignee: Hydro Quebec, Montreal, Canada

[21] Appl. No.: 461,870

[22] Filed: Jan. 28, 1982

[51] Int. Cl.[3] .............................................. G01R 31/08
[52] U.S. Cl. ........................................ 324/52; 324/51
[58] Field of Search ..................................... 324/52, 51

[56] References Cited

U.S. PATENT DOCUMENTS 2,219,262  10/1940  Maple et al. ....................... 324/52 X

FOREIGN PATENT DOCUMENTS 137212  12/1902  Fed. Rep. of Germany ........ 324/52

OTHER PUBLICATIONS

Westinghouse's Descriptive Bulletin 33-650D WEA, Entitled "Type CGI Compressed Gas Insulated Bus", Apr. 1975.
C. A. Ekdahl, Rev. Sci. Instrument 51, vol. 12, 1645 (1980).
M. G. Drouet et al., IEEE Trans. PAS-100, No. 7, 3350, Jul. 1981.
S. A. Boggs et al., IEEE Trans., PAS-100, No. 8, 3969, Aug. 1981.
S. A. Boggs, IEEE Trans., PAS-101, 1935, Jul. 1982.
M. S. Di Capua, Article Entitled "Rogowski Coils, Fluxmeters and Resistors for Pulsed Current Measurements", Apparently not yet Published.
M. G. Drouet, "Comments on Voltage and Current Sensors for a High Density Z-Pinch Experiment", Rev. Sci. Instrum 53(s), 263, Feb. 1982.

Primary Examiner—Stanley T. Krawczewicz
Attorney, Agent, or Firm—Schwartz, Jeffery, Schwaab, Mack, Blumenthal & Koch

[57] ABSTRACT

A device and a method for detecting and locating faults and/or partial discharges in a gas-insulated electrical equipment, such as gas-insulated bus or cable, a gas-insulated substation or a gas-insulated switchgear. The detecting device comprises a plurality of field coupled current sensors located at given intervals inside the housing of the equipment for detecting any variation of the current flowing through the conducting element extending inside this housing. Each sensor consists of a toroidal helix pick up coil, preferably a differentiating Rogowski coil, located in an annular cavity machined in the wall of the equipment housing and extending all around the conducting element. Each cavity is connected along its entire length to the inner surface of the housing wall by a slit having opposed side walls sufficiently spaced apart to be insulated from each other. Each sensor gives a signal which is proportional to the detected variation of the current. A control circuit is connected to each of the sensors for comparing their signals and measuring the time interval between all the signals given by the sensors of a given variation current, and thereby determining where is located the fault or partial discharge having caused this given variation of current. The main advantages of this device are that it is not electrically connected to the circuit carrying the main current and it is not influenced by the voltage drop associated with the flow of current on the inside surface of the annular cavities. Moreover, the sensitivity of the device is a function of the number of turns in the pick up coil, and therefore can be very high.

15 Claims, 6 Drawing Figures

METHOD AND DEVICE FOR DETECTING AND LOCATING FAULT AND/OR PARTIAL DISCHARGES IN A GAS-INSULATED ELECTRICAL EQUIPMENT

BACKGROUND OF THE INVENTION (a) Field of the Invention

The present invention relates to the device and a method for detecting and locating faults and/or partial discharges in a gas-insulated electrical equipment of the type comprising a closed wall housing containing an insulated gas such as $SF_6$, for electrically insulating at least one conducting element centrally extending inside the housing.

More particularly, the present invention relates to a device and a method for detecting and locating faults and/or partial discharges in a gas-insulated bus or cable, a gas-insulated substation or a gas-insulated switchgear.

(b) Description of the Prior Art

It is well known in the art that faults and/or partial discharges in a gas-insulated equipment such as a gas-insulated cable or switchgear, generally correspond to malfunction problems that may often lead to failures.

To protect the equipment as much as possible and to reduce the maintainance cost, various devices and methods have already been proposed to detect and locate the faults and partial discharges, in view of eliminating their sources which can be, for example, the presence of an equipment component not bounded to the conductor or to its housing, the presence of free conducting particles in the insulating gas, or a failure in the dielectric material used in the equipment. The faults or discharges which may directly damage the equipment or decompose the insulating gas and create a corrosion problem, generates a high frequency electromagnetic signal which can be detected acoustically. The faults or partial discharges can also be detected by an electromagnetical method such as the one disclosed by S. A. BOGGS et al, IEEE Trans. volume PAS-100, No. 8, August, 1981. This method makes use of a plurality of coaxial capacitive couplers connected to the housing of the equipment by a resistor and an inductor. The couplers which are designed to have a high pass characteristic, detect the electromagnetic pulses which propagate away from a discharge source in opposite direction. By measuring the time interval between the detection of a given pulse by all the couplers, it is possible to locate the faults and/or discharge source, provided that the length between each pair of couplers is known. For this measurement, use can be made, for example, of an integrating autocorrelator such as the one developed by the Research Division of Ontario Hydro (see S. A. BOGGS, IEEE, Trans PAS-101, p. 1935, July 1982).

This known method is quite efficient but has some drawbacks. One of these drawbacks is the position of the couplers which extend around the conducting element inside the equipment housing and disturb the electrical field around this conducting element to such an extent that it may cause in time another source of fault. Another drawback is the presence of unavoidable free particles left over during the construction of the equipment, which may deposit onto the surface of the couplers and cause malfunction thereof.

It has also been suggested in the art to use current sensors for measuring the variation of current in time at a given point of a transmission line. The use of such an current sensor is disclosed, by way of example, by C. A. EKDAHL, Rev. Sci. Instrument. 51, 1645 (1980). The current sensor disclosed by C. A. EKDAHL is used for monitoring a current wave formed in a high density gas-embedded Z pinch, and consists of an annular channel machined in the surface of one flange of a pair of flanges used for attaching to each other sections of the equipment housing. An insulating gap is machined in the flange surface to force the current in the inner wall of the housing to flow around the annular channel. An O-ring can be provided in the gap for preventing the insulating gas from escaping into the annular channel. The voltage generated across the annular channel is picked up by a series resistor connected by an insulated wire between the opposing flanges. In this particular case, the picked-up voltage is not solely proportional to the derivative of the current flowing through the central conductor of the equipment with respect to the time. It also includes the ohmic voltage drop associated with the flow of current on the inside surfaces of the opposing flanges.

SUMMARY OF THE INVENTION

The object of the present invention is to provide a device and a method for detecting and locating faults and/or partial discharges in a gas-insulated electrical equipment, which combine and substantially improve the above mentioned methods and devices developed by S. A. BOGGS et al and C. A. EKDAHL.

More particuarly, the object of the present invention is to provide a method and a device detecting and locating faults and partial discharges in a gas-insulated electrical equipment, which makes use of the methodology developed by S. A. BOGGS et al and takes advantage of the flange geometry designed by C. A. EKDAHL, to accomodate toroidal helix pick up coils in annular cavities machined in the housing wall, which coils give output voltage signals in correlation with the variation of current flowing through the conducting element.

It should be noted that the use of a toroidal helix pick up coil for measuring the variation of a current flowing in a conductor passing through the coil, is well known in the art. This kind of coil which is also called <<Rogowski coil>>, has been made the subject matter of numerous developments reported in a large numbers of papers.

However, in accordance with the present invention it has surprisingly been found that very significative and efficient results are obtained by a combination of the methodology developed by S. A. BOGGS et al with the very particular, flange geometry designed by C. A. EKDAHL, provided that use be made of a different type of current sensor, namely a toroidal helix pick up coil positioned into an annular channel such as the one used by C. A. EKDAHL, instead of using this channel per se as current sensor.

The method and device according to the invention has several advantages over the methods and devices developed by S. A. BOGGS et al and C. A. EKDAHL respectively. First of all, it does not make use of capacitive couplers as S. A. BOGGS et al do, and thus it avoids the above mentioned drawbacks caused by such a use. Also, the insertion of toroidal helix pick up coils into annular cavities such as those used by C. A. EKDAHL advantageously permits to avoid the electrical field perturbation and aging phenomena encountered with the capacitive couplers. Moreover, the use of toroidal helix pick up coils has several advantages over the use of current sensor as proposed by C. A. EK-DAHL. Indeed, when use is made of toroidal helix pick up coils, the measuring circuit is not affected by any current that may be carried out by the housing wall, since the current flows externally around the coil. In addition, the measuring circuit is not influenced by the Ohmic voltage drop associated with this flow of current. Furthermore, the sensitivity of the measuring circuit does not depend on the area of the channel, but on the number of turns in each pick up coil. Therefore, for an equivalent geometry to that of EKDAHL, a substantially increased sensitivity can be obtained in a very simple manner.

More particularly, the present invention proposes an improved device for detecting and locating fault and partial discharges in a gas-insulated electrical equipment to the type comprising a closed wall housing containing an insulated gas for electrically insulating at least one conducting element centrally extending inside the housing. This device basically comprises:

a plurality of field coupled current sensors located at given intervals inside the housing for detecting any variation of the current flowing through the conducting element, each sensor giving a signal in correlation with the detected variation, and a control circuit connected to each of the sensors for comparing their signals and measuring the time intervals between all the signals given by the sensors of a given variation of current, and thereby determining where is located the faults and/or partial discharges causing this given variation of current.

In accordance with the invention, this device is improved in that each sensor comprises a toroidal helix pick up coil located in an annular cavity machined in the housing wall and extending all around the conducting element. Each annular cavity is connected along its entire length to the inner surface of the housing wall by a slit having opposite side walls sufficiently spaced apart to be insulated from each other. The slit advantageously forces the current induced or flowing in the housing to flow externally around the coil and not to affect its measurement. The slit also permits the coil which is not directly located in the housing and thus does not cause field perturbations, to be induced by the current flowing in the conducting element.

Preferably, each toroidal helix pick up coil is a differentiating Rogowski coil giving an output voltage signal proportional to the derivative of the current flowing to the conducting element with respect to the time.

In accordance with a first preferred embodiment, the improved device according to the invention is used in a gas-insulated electrical equipment such as a gas-insulated bus or cable, a gas-insulated substation or a gas-insulated switchgear, comprising a plurality of housing sections attached end to end by a plurality of pairs of flanges having opposing surfaces. In this particular embodiment, the coil receiving cavities are all machined in the opposing surfaces of different pairs of flanges.

In accordance with another preferred embodiment, the improved device according to the invention is used in a gas-insulated electrical equipment such as a gas-insulated bus or cable, comprising a plurality of housing sections attached end to end by means of welding-ring inserts. In this case, the coil receiving cavities are all machined in the welding ring inserts.

The improved device according to the invention may further comprise a high pass-filter connected between each coil and the control circuit, for discriminating high frequency signals that correspond to a fault and/or partial discharge from low frequency signals caused by any current flowing or induced in the conducting element.

It should be noted that each coil cn be used not only for detecting and locating faults and/or partial discharges, but also for measuring the current flowing through the conducting element. Indeed, by using a suitable filter, it is possible to measure the total current or the current flowing in one given phase, and thus to detect any amplitude variation of one phase with respect to the others. To do so, the output voltage signal given by the coil, which signal is proportional to the derivative current flowing into the conducting element with respect to the time, has to be integrated by the control circuit.

The present invention also proposes a method for detecting and locating fault and partial discharges in a gas-insulated electrical equipment of the type comprising a closed wall housing containing an insulating gas for electrically insulating at least one conducting element centrally extending inside the housing. This method which comprises the same basic steps as the BOGGS et al method, namely:

providing field coupled sensors at given intervals inside the housing;

detecting the current induced in each sensor by the current flowing through the conducting element;

measuring the time interval between detections by all the sensors of a given variation of current, and thereby determining where is located the fault and/or partial discharge having caused said given variation of current, is improved in that use is made as sensors, of toroidal helix pick-up coils each located in an annular cavity machined in the housing wall and extending all around the conducting element. Each cavity is connected along its entire length to the inner surface to the housing wall by a slit having opposed side walls sufficiently spaced apart to be insulated from each other and thus let the current induce a voltage in the coil.

It should be noted that the improved device and method according to the invention can be used with any kind of gas-insulated electrical equipment. Thus, by way of example, the device and method can be used with a gas-insulated bus or cable, a gas insulated substation or a gas-insulated switchgear. The device can be mounted in a permanent manner in the equipment when assembling it, and thus may be used in a preventive manner as well as in a failure situation.

BRIEF DESCRIPTION OF THE DRAWINGS

The invention will be better understood with reference to the following description of two preferred embodiments thereof, taken in connection with the accompanying drawings in which.

DESCRIPTION OF PREFERRED EMBODIMENTS

Figure 1:
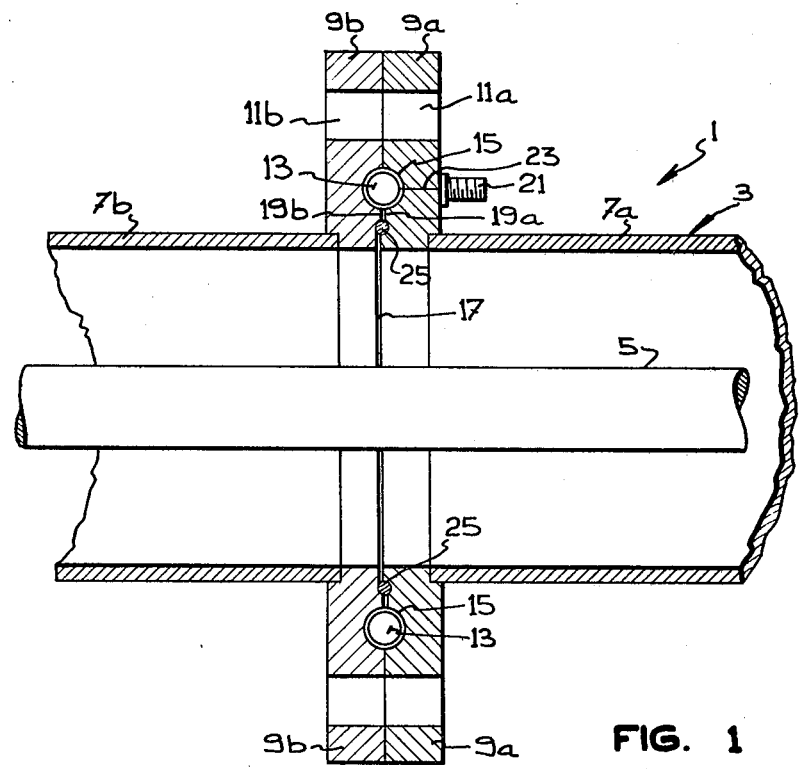
FIG. 1 is a cross-sectional view of a gas-insulated cable comprising a plurality of sections attached end to end by means of flanges, with a Rogowski coil mounted into a cavity machined in one pair of flanges.
Figure 4:
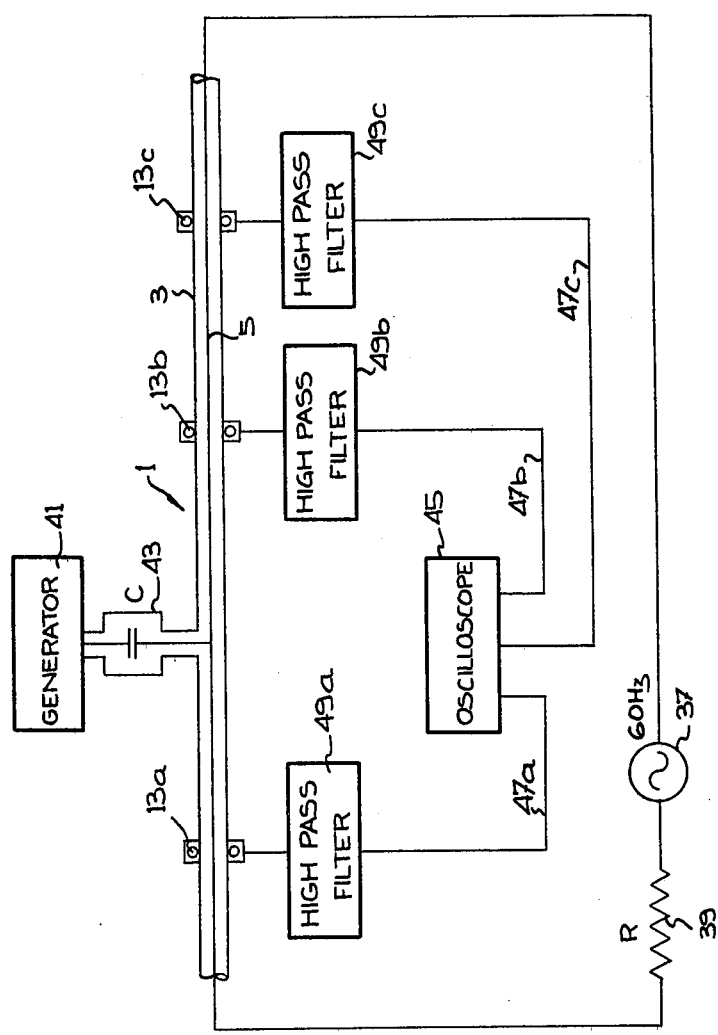
FIG. 4 is a schematic view of an experimental equipment incorporating a device according to the invention.

The device according to the invention as shown in a very schematic manner in FIG. 4, is intended to detect and locate faults and partial discharges in a gas-insulated electrical equipment, such as the gas-insulated cable 1 shown in FIG. 1.

The gas-insulated cable 1 comprises a closed wall housing (or sheath) 3, which contains an insulating gas preferably chemically inert, non toxic, colourless, odorless and uninflammable such as $SF_6$. The gas is used for electrically insulating a conductor 5 centrally extending inside the housing. The housing 3 can be made of plurality of grounded aluminum-alloy tubes sections 7a, 7b, . . . which are attached end to end by means of flanges 9a and 9b radially extending the ends of each section.

Figure 2:
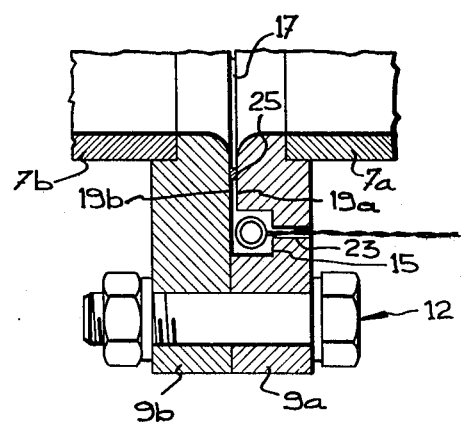
FIG. 2 is a partial view similar to the one shown in FIG. 1, showing a variant of construction.

The conductor 5 can be a concentrically centered tubular aluminum-alloy conductor held in place inside the housing 3 by means of insulated spacers (not shown). The flanges 9a and 9b used for attaching together the sections of the housing, have opposing surfaces that can be bolted to each other with bolts and nuts 12 as shown in FIG. 2, passing through holes 11a and 11b provided for this purpose in the flanges.

In accordance with the invention, a plurality of toroidal helix pick-up coils 13 are located in annular cavities 15 machined in the housing wall and extending all around the conductor 5. Advantageously, each toroidal helix pick-up coil 13 is a differentiating Rogowski coil giving an output voltage signal proportional to the derivative of the current flowing to the conductor with respect to the time, according to the following equation:

$$V = M(di/dt)$$

In this equation, M is a constant which depends on the structure of the coil and the coupling characteristics between this coil and the cavity. As can be easily understood, it is possible to vary either the structure of the coil and/or the coupling of this coil to obtain any desired measurement sensibility.

As shown in FIG. 1, every coil receiving cavity 15 can be symmetrically machined in the opposing surfaces of each pair of flanges 9a and 9b. As shown in FIG. 2, every coil receiving cavity can also be machined in the surface of one flange 9a of each pair of flanges used for attaching the housing sections to each other.

To allow inductive coupling of the coil, each cavity 15 must be connected along its entire length to the inner surface to the wall of the housing 3 by a slit 17 having opposite side wall 19a and 19b sufficiently spaced apart to be insulated from each other. In the embodiment shown in FIG. 1 and its variant shown in FIG. 2, the side walls 19a and 19b of the slit 17 connecting the cavity 15 to the inner surface of the housing wall are portions of the opposing surfaces of the flanges 9a and 9b. To prevent the insulating gas from escaping from the inside of the housing, a non-conductive O-ring 25 can be provided in the slit.

The terminals of each Rogowski coil 13 are connected via a hole 23 passing through one of the flanges, to a connector 21 as shown in FIG. 1.

Figure 3:
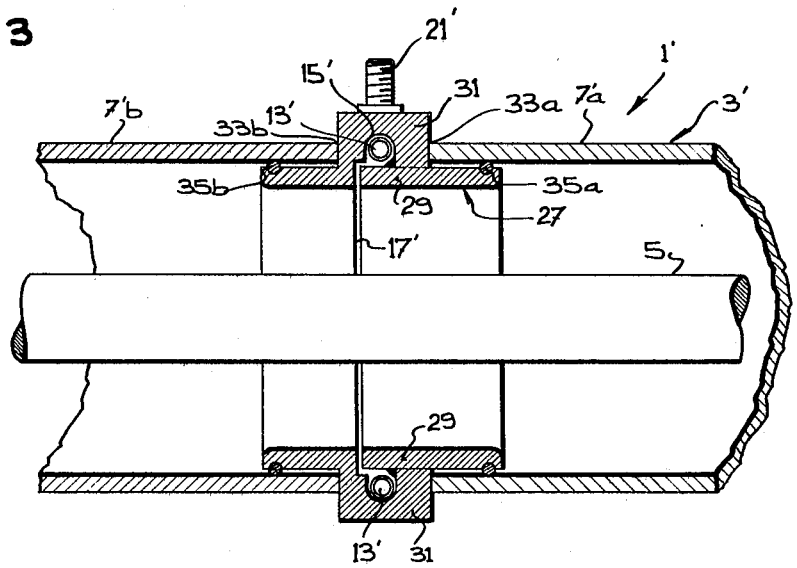
FIG. 3 is a cross-sectional view of a gas-insulated cable comprising a plurality of sections attached end to end by means of welding-ring inserts, with a Rogowski coil mounted into a cavity machined in one insert.

The device according to the invention can also be used in the other kind of gas-insulated equipment, such as the gas insulated cable equipment 1' shown on FIG. 3, which is substantially similar to the one shown in FIGS. 1 and 2, except that the sections 7'a and 8'b of the housing are connected to each other by means of welding ring inserts 27 instead of being connected by means of flanges. In this very specific embodiment, the structural elements of the cable similar to those previously described in connection with FIGS. 1 and 2, have been identified with the same reference numerals, provided with a prime indicia $<<'>>$. In this very specific embodiment, the coil 13' is located inside an annular cavity 15' provided into the inserts 27 which preferably has a T-shaped cross-section with a horizontal bar 29 and a vertical bar 31. Two O-ring 35a and 35b are used to seal the joint and protect the conductor for weld-splatters when the ends of the housing 7'a and 7'b are welded onto the lateral surfaces of the vertical bar 31 of the insert. To facilitate the construction of the annular cavity 15', each ring insert 27 can be made of two pieces that can be welded to each other after the coil 13' has been positioned and electrically connected to its external connector 21'.

Each coil 13 or 13' located at given intervals inside the housing flanges or inserts are used for detecting any variation of the current flowing through the conducting element.

As shown in greater detail on FIG. 4, each coil 13a, 13b, 13c . . . located at given intervals inside the flanges or inserts of a cable is connected to a control circuit 45 which can be an oscilloscope or an oscillograph, by means of a plurality of insulated wires 47a, 47b, 47c . . . respectively. The control circuit 45 is used for comparing the signals received from each coil and measuring the time interval between the signals given by all the coils of a given variation of current, and thereby determining where is located the fault and/or partial discharge causing this given variation of current. Indeed, when a fault or a partial discharge occurs in the cable between the conductor 5 and the housing 3, the current generated by this fault or partial discharge, which current is generally a high frequency current, propagates away from its source onto the inner surface of the housing. Because of the slits 17, the propagating current is obliged to flow externally around the coil and does not effect the signal of the coil located inside the cavity. This signal which is proportional to the variation in time of the current inside the conductor indicates any variation of the current due to the fault or partial discharge. This signal is detected at different times by the coils located at different places along the cable, according to the speed of the current propagating in the cable. If the length of cable between each pair of coils is known, it is therefore very easy to precisely determine where is located the fault and/or partial discharge from the time intervals measured with the oscillograph 45.

In order to obtain better results, use can be made of a high pass filter between each coil and the control circuit, for discriminating the high frequency signals given by the coil, which correspond to a fault and/or partial discharge, from the low frequency signals caused by any current flowing in or induced in the conductor.

Using the circuit shown in FIG. 4, experiments were carried out, using an HP 8012B generator 41 as source of partial discharge. In order to inject a fault signal in the conductor 5, use was made of a capacitive coupling 43. During the experiment, the conductor 5 was connected to a AC current source 37 (60 Hz) via a resistance 39.

Figure 5:
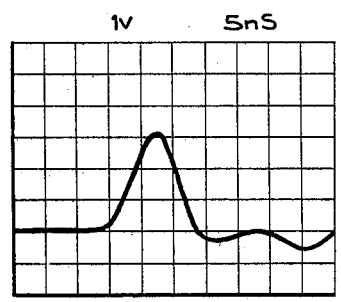
FIG. 5 is an oscillographic representation of a fault signal experimentally injected with a generator in the cable of the experimental equipment of FIG. 4.
Figure 6:
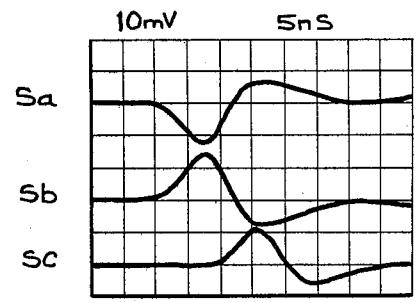
FIG. 6 is an oscillographic representation of the signals measured by the Rogowski coils used in the experimental equipment of FIG. 4.

During the experiment, a fault signal such as the one shown in FIG. 5, was injected into the cable 1 by the generator 41. The signal Sa, Sb and Sc that were detected by the coils 13a, 13b and 13c are shown in FIG. 6. As can be seen on this figure, the signal Sa and Sb detected by coil 13a and 13b between which was injected the fault signal arrived to the oscillograph at the same time but had inversed polarities. This was indicative that the fault signal was originating from source located between coil 13a and 13b substantially at mid distance of them. The signal Sc received by the coil 13c was identical to the one received by the coil 13b but with a short delay. This was also indicative that the fault signal was coming from the same direction as coil 13b.

By properly calibrating the gas-insulated equipment 1, it is possible to calculate the speed at which propagates the fault current and thereby to determine where is located the fault by mere measurement of the time intervals.

In this regard, it should be noted that each coil 13a, 13b and 13c must be connected to the oscilloscope or oscillograph 45 by wires 47a, 47b and 47c of the same length, to avoid any delay between the detected signals, which delay could affect the measurement and thus the location of the fault. Wires not of the same length can of course be used, but time correction must then be made.

What is claimed is:

1. In a device for detecting and locating faults and partial discharges in a gas-insulated electrical equipment of the type comprising a closed wall housing containing an insulating gas for electrically insulating at least one conducting element centrally extending inside said housing, said device comprising:
   a plurality of field coupled current sensors located at given intervals inside the housing for detecting any variation of the current flowing through the conducting element, each of said sensors giving a signal in correlation with said detected variation; and
   a control circuit connected to each of the sensors for comparing their signals and measuring the time interval between all the signals given by the sensors of a given variation of current, and thereby determining where is located the fault and/or partial discharge causing said given variation of current
   the improvement wherein:
   each of said sensors comprises a toroidal helix pick up coil located in an annular cavity machined in the housing wall and extending all around the conducting element,
   each of said annular cavities being connected along its entire length to the inner surface of the housing wall by a slit having opposed side walls sufficiently spaced apart to be insulated from each other.

2. The improved device of claim 1, wherein each toroidal helix pick up coil is a differentiating Rogowski coil giving an output voltage signal proportional to the derivative of the current flowing through the conducting element with respect to the time.

3. The improved device of claim 2 for use in a gas-insulated electrical equipment comprising a plurality of housing sections attached end to end by pairs of flanges having opposing surfaces, wherein the coil receiving cavities are machined in the opposing surfaces of different pairs of flanges.

4. The improved device of claim 3, wherein each coil receiving cavity is machined in the surface of one flange of one of said pairs of flanges, and the opposed side walls of the slit connecting said cavity to the inner surface of the housing wall are portions of opposing surfaces of said one pair of flanges.

5. The improved device of claim 4, further comprising a high-pass filter connected between each coil and the control circuit, for discriminating high frequency signals that correspond to a fault and/or partial discharge, from low frequency signals caused by any current flowing in, or induced in the conducting element.

6. The improved device of claim 5, wherein the gas-insulated electrical equipment is a gas-insulated bus or cable, a gas-insulated substation or a gas-insulated switchgear.

7. The improved device of claim 2 for use in a gas-insulated electrical equipment comprising a plurality of housing sections attached end to end by means of welding-ring inserts, wherein the coil receiving cavities are all machined in different welding-ring inserts.

8. The improved device of claim 7, further comprising a high-pass filter connected between each coil and the control circuit, for discriminating high frequency signals that correspond to a fault and/or partial discharge, from low frequency signals caused by any current flowing in, or induced in the conducting element.

9. The improved device of claim 8, wherein the gas-insulated electrical equipment is a gas-insulated bus or cable.

10. In a method for detecting and locating faults and/or partial discharges in a gas-insulated electrical equipment of the type comprising a closed wall housing containing an insulating gas for electrically insulating at least one conducting element centrally extending inside said housing, said method comprising the steps of:
    providing field coupled sensors at given intervals inside the housing;
    detecting the current induced in each sensor by the current flowing through the conducting element;
    measuring the time interval between detections by all the sensors of a given variation of current, and
    thereby determining where is located the fault and/or partial discharge having caused said given variation of current,
    the improvement wherein:
    use is made as sensors, of toroidal helix pick-up coils each located in an annular cavity machined in the housing wall and extending all around the conducting element, each of said cavities being connected along its entire length to the inner surface of the housing wall by a slit having opposed side walls sufficiently spaced apart to be insulated from each other.

11. The improved method of claim 10, wherein the toroidal helix pick-up coils are differentiating Rogowski coils giving an output voltage signal proportional to the derivative of the current flowing through the conducting element with respect to the time.

12. The improved method of claim 11, applied to the detection and location of faults and/or partial discharges in a gas-insulated bus or cable, gas insulated substation or gas-insulated switchgear wherein the coil receiving cavities are machined in opposing surfaces of different pairs of flanges used for attaching together sections of the housing wall of the equipment.

13. The improved method of claim 12, comprising the additional step of filtering high frequency current variations that correspond to a fault and/or partial discharge, from low frequency current variations that are caused by the current flowing in, or induced in the conducting element.

14. The improved method of claim 11 applied to the detection and location of faults and/or partial discharges in a gas-insulated bus or cable, wherein the coil receiving cavities are machined in different welding-ring inserts used for attaching together sections of the housing wall of the equipment.

15. The improved method of claim 14, comprising the additional step of filtering high frequency current variations that correspond to a fault and or partial discharge, from low frequency current variations that are caused by the current flowing in, or induced in the conducting element.

* * * * *

UNITED STATES PATENT AND TRADEMARK OFFICE
CERTIFICATE OF CORRECTION

PATENT NO. : 4,446,420

DATED : May 1, 1984

INVENTOR(S) : Michel G. Drouet

It is certified that error appears in the above-identified patent and that said Letters Patent is hereby corrected as shown below:

On the title page

Change "[22] Filed: Jan. 28, 1982" to

--[22] Filed: Jan. 28, 1983--

Signed and Sealed this

Fourth Day of December 1984

[SEAL]

Attest:

GERALD J. MOSSINGHOFF

Attesting Officer

Commissioner of Patents and Trademarks